US009733749B2

(12) United States Patent
Liu et al.

(10) Patent No.: US 9,733,749 B2
(45) Date of Patent: Aug. 15, 2017

(54) TOUCH PANEL AND METHOD FOR FORMING A TOUCH STRUCTURE

(71) Applicant: TPK Touch Solutions Inc., Taipei, Taiwan (CN)

(72) Inventors: Chen-Yu Liu, Taoyuan (CN); Lu-Hsing Lee, Taoyuan (CN)

(73) Assignee: TPK Touch Solutions Inc., Taipei (TW)

( * ) Notice: Subject to any disclaimer, the term of this patent is extended or adjusted under 35 U.S.C. 154(b) by 135 days.

(21) Appl. No.: 14/653,262

(22) PCT Filed: Dec. 18, 2013

(86) PCT No.: PCT/CN2013/089885
§ 371 (c)(1),
(2) Date: Jun. 17, 2015

(87) PCT Pub. No.: WO2014/094624
PCT Pub. Date: Jun. 26, 2014

(65) Prior Publication Data
US 2016/0195974 A1    Jul. 7, 2016

(30) Foreign Application Priority Data

Dec. 18, 2012  (CN) .......................... 2012 1 0552359

(51) Int. Cl.
G06F 3/042  (2006.01)
G06F 3/041  (2006.01)
G06F 3/044  (2006.01)
H05K 1/02  (2006.01)
H05K 3/28  (2006.01)

(52) U.S. Cl.
CPC ............ *G06F 3/0416* (2013.01); *G06F 3/044* (2013.01); *H05K 1/0274* (2013.01); *G06F 2203/04103* (2013.01); *H05K 1/0289* (2013.01); *H05K 3/28* (2013.01); *H05K 2203/0577* (2013.01)

(58) Field of Classification Search
USPC ............ 345/173, 174, 175; 349/12; 174/256
See application file for complete search history.

(56) References Cited

U.S. PATENT DOCUMENTS

2005/0052582 A1* 3/2005 Mai ..................... G02F 1/13338
349/12
2009/0273572 A1* 11/2009 Edwards ................ G06F 3/044
345/173

(Continued)

FOREIGN PATENT DOCUMENTS

CN    101819482 A    9/2010
CN    102446019 A    5/2012
CN    202351830 U    7/2012

*Primary Examiner* — Thuy Pardo
(74) *Attorney, Agent, or Firm* — Paul Bendemire

(57) ABSTRACT

A manufacturing process for forming a touch structure utilizes a first anti-etching optical layer to define the electrodes pattern and utilizes a second anti-etching optical layer to define the traces pattern. The first anti-etching optical layer and the second anti-etching optical layer do not need to be removed. The refractive index of the first anti-etching optical layer and the refractive index of the second anti-etching optical layer can be adjusted to reduce the display difference between the etched region and the non-etched region.

19 Claims, 16 Drawing Sheets

(56) References Cited

U.S. PATENT DOCUMENTS

| | | | | |
|---|---|---|---|---|
| 2011/0001721 A1* | 1/2011 | Chiang | ................... | G06F 3/044 |
| | | | | 345/174 |
| 2011/0199330 A1* | 8/2011 | Hsu | ........................ | G06F 3/044 |
| | | | | 345/174 |
| 2012/0080217 A1* | 4/2012 | Kim | ....................... | G06F 3/044 |
| | | | | 174/256 |
| 2012/0306814 A1* | 12/2012 | Chiang | ................... | G06F 3/044 |
| | | | | 345/174 |
| 2013/0127790 A1* | 5/2013 | Wassvik | .................. | G06F 3/042 |
| | | | | 345/175 |
| 2013/0215050 A1* | 8/2013 | Lai | .......................... | G06F 3/041 |
| | | | | 345/173 |
| 2014/0078077 A1* | 3/2014 | Choi | .................... | H01L 27/323 |
| | | | | 345/173 |
| 2014/0225855 A1* | 8/2014 | Aitchison | ............... | G06F 3/041 |
| | | | | 345/173 |
| 2015/0138161 A1* | 5/2015 | Wassvik | .................. | G06F 3/042 |
| | | | | 345/175 |
| 2016/0085350 A1* | 3/2016 | Edwards | ................. | G06F 3/044 |
| | | | | 345/174 |

\* cited by examiner

TOUCH PANEL AND METHOD FOR FORMING A TOUCH STRUCTURE

BACKGROUND OF THE INVENTION

Technical Field

The disclosure relates to the touch sensing technology, and more particularly to touch panel structures and manufacturing processes thereof.

Description of the Related Art

In conventional touch electrode manufacturing processes, the main process comprises, forming electrode structures and forming traces, wherein a hard mask is used to define the pattern of the electrode structures and the pattern of the traces, which is removed after the process is performed.

In order to provide a better display effect of a touch panel, an additional optical layer is formed on the touch structure, so as to adjust the display effect of the touch panel.

Therefore, the conventional process is complicated, and needs additional processes to adjust the display effect of the touch panel.

SUMMARY OF THE INVENTION

To solve the issue mentioned above, the present disclosure provides simplified manufacturing processes that also improve the display effect of the touch panel.

The present disclosure provides a manufacturing process for forming a touch structure, at least comprising the following steps:

S1: providing a substrate, wherein a sensing region and a trace region surrounding the sensing region are defined on the substrate;

S2: forming an electrode layer on the substrate;

S3: forming a first anti-etching optical layer on the electrode layer;

S4: etching the electrode layer that is not covered by the first anti-etching optical layer, thereby dividing the electrode layer into an etched region and a non-etched region;

S5: forming a second anti-etching optical layer on the first anti-etching optical layer and on the substrate, wherein the second anti-etching optical layer at least exposes pails of the first anti-etching optical layer within the trace region;

S6: etching the first anti-etching optical layer that is not covered by the second anti-etching optical layer to expose the electrode layer of the non-etched region within the trace region; and S7: forming a trace layer disposed within the trace region, wherein the trace layer is electrically connected to the exposed electrode layer of the non-etched region.

The present disclosure provides a touch panel comprising a substrate having a sensing region and a trace region surrounding the sensing region, an electrode layer, disposed on the substrate, wherein the electrode layer is divided into an etched region and a non-etched region, a first anti-etching optical layer, disposed on the electrode layer of the non-etched region, a second anti-etching optical layer, disposed on the first anti-etching optical layer and on the substrate, and at least parts of the electrode layer within the trace region is exposed by the first anti-etching optical layer and the second anti-etching optical layer, and a trace layer, disposed within the trace region, and electrically connected to the exposed electrode layer of the non-etched region.

The refractive index of the first anti-etching optical layer and the refractive index of the second anti-etching optical layer can be adjusted, so that the display difference between the etched region and the non-etched region can be reduced.

Compared to the conventional process, the present disclosure does not need the steps of removing the hard mask to define the electrode pattern and removing the hard mask to define the trace pattern, so the manufacturing process can be simplified, thereby improving the yield.

These and other objectives of the present disclosure will no doubt become obvious to those of ordinary skill in the art after reading the following detailed description of at least the preferred embodiment that is illustrated in the various figures and drawings.

BRIEF DESCRIPTION OF THE DRAWINGS

FIG. 2a'-FIG. 2f' are cross sectional views taken along the section line B-B' of FIG. 2a-FIG. 2f.

FIG. 2g'-1 and FIG. 2h'-1 are cross sectional views taken along the section line B-B' of FIG. 2g and FIG. 2h respectively.

FIG. 2g'-1 and FIG. 2h'-2 are cross sectional views taken along the section line C-C' of FIG. 2g and FIG. 2h respectively.

FIG. 3a'-1, FIG. 3b'-1 and FIG. 3c'-1 are cross sectional views taken along the section line B-B' of FIG. 3a, FIG. 3b and FIG. 3c respectively.

FIG. 3b'-2 and FIG. 3c'-1 are cross sectional views taken along the section line C-C' of FIG. 3b and FIG. 3c respectively.

FIG. 4a~FIG. 4c are top views of a touch structure according to various embodiments of the present disclosure.

FIG. 6a'-1 is a cross sectional view taken along the section line B-B'

FIG. 6a'-2 is a cross sectional view taken along, the section line C-C' of FIG. 6b.

FIG. 7b is a cross sectional view of FIG. 7a.

FIG. 8a and FIG. 8c are top views of the touch structure according to FIG. 8a respectively.

FIG. 9 is a cross sectional view of a touch device used the touch structure of FIG. 8a.

DESCRIPTION OF THE PREFERRED EMBODIMENT

Figure 1:
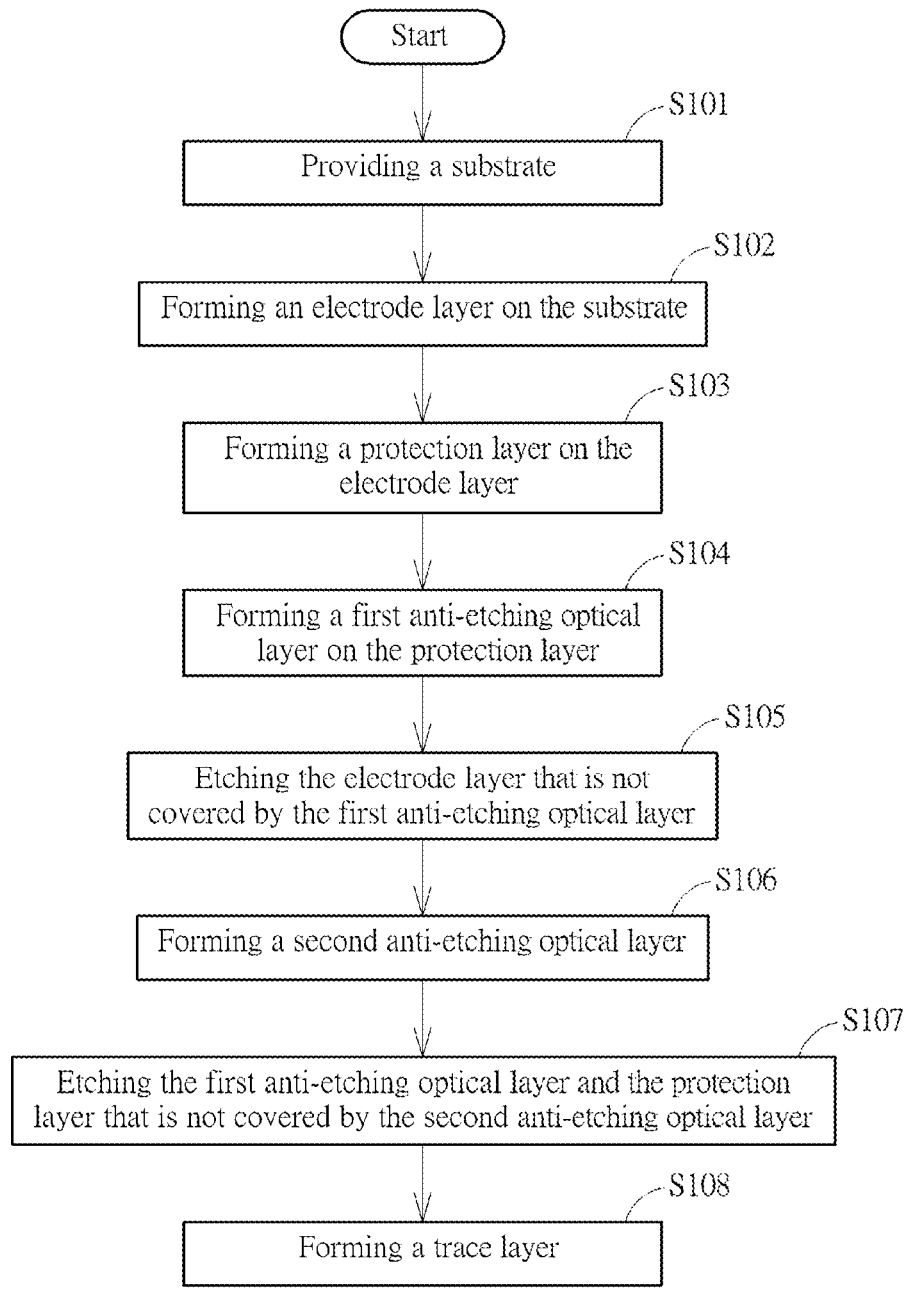
FIG. 1 is a flow chart showing the manufacturing process of a touch structure according to various embodiments of the present disclosure.
Figure 2A:
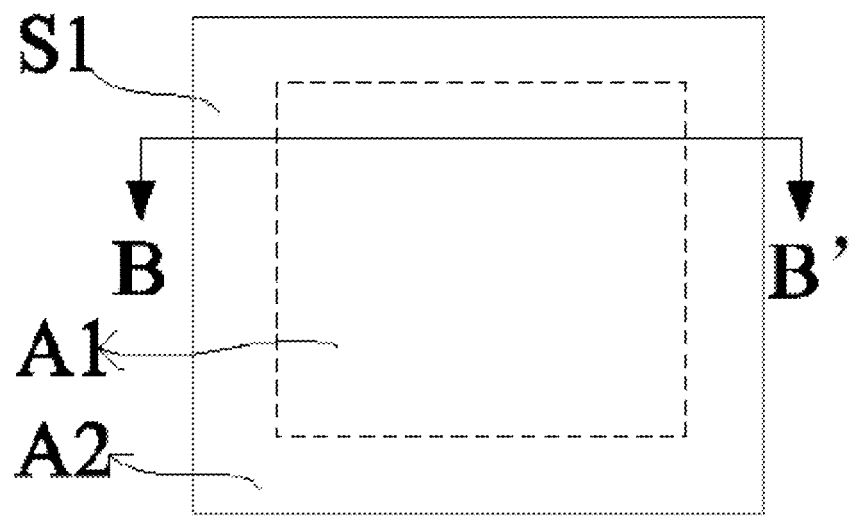
FIG. 2a-FIG. 2h are top views of a touch structure according to various embodiments of the present disclosure.

FIG. 1 is a flow chart showing a manufacturing process of a touch structure according to one or more preferred embodiments of the present disclosure. As shown in FIG. 1, the process comprises the following steps:

S101: providing a substrate. Please refer to FIG. 2a and FIG. 2a. In some embodiments, the substrate 110 comprises glass or polyethylene terephthalate (PET). In some embodiments, the substrate 110 has a flat shape or a curved shape so as to be adapted to different types of touch panels. In some embodiments, the substrate 110 is a rigid substrate or a flexible substrate. The substrate 110 has a first surface S1 and an opposite second surface S2. A sensing region A1 (the region delimited by dot lines in FIG. 2a) and a trace, region A2 surrounding the sensing region A1 are defined on the substrate 110.

Figure 2B:
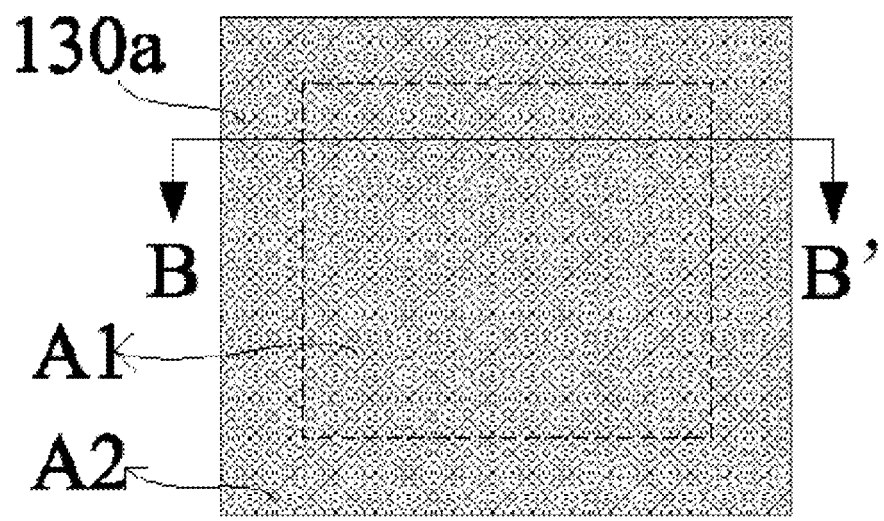
Figure 2B:
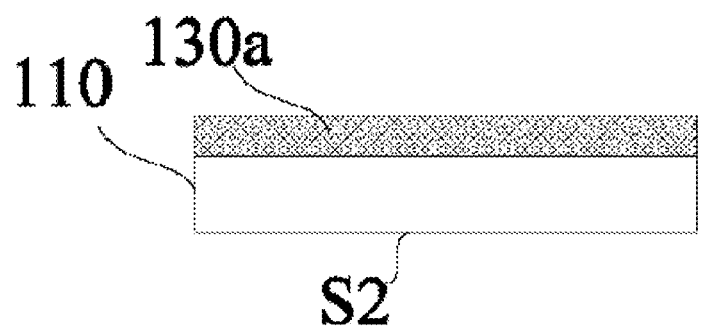

S102: forming an electrode layer on the substrate. Please refer to FIG. 2b' and FIG. 2b. An electrode layer 130a is formed on the first surface S1 of the substrate 110. The electrode layer 130a comprises silver nano-wires (SNW), carbon nano tubes (CNT), graphene, a conductive polymer, a metal oxide layer such as indium tin oxide (ITO), aluminum zinc oxide (AZO) or other transparent materials. In some embodiments, the electrode layer 130a is formed through a deposition process or a sputtering process.

Figure 2C:
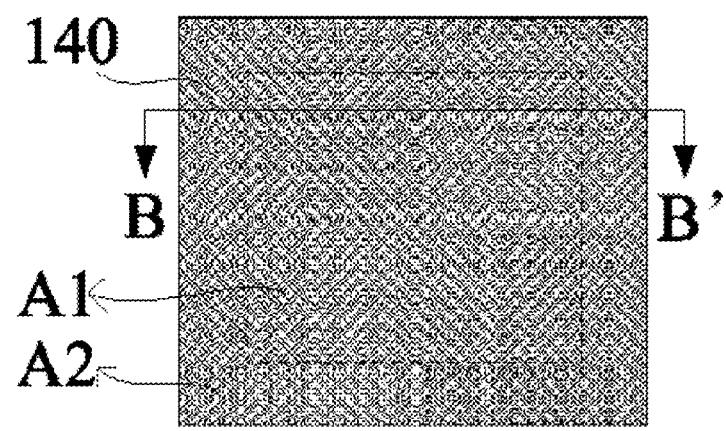
Figure 2C:
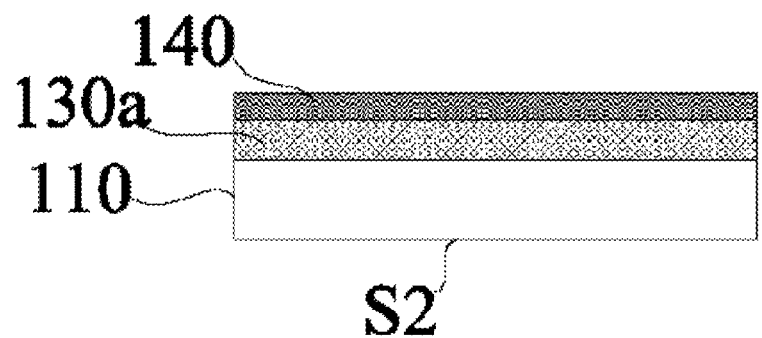

S103: forming a protection layer on the electrode layer. Please refer to FIG. 2c' and FIG. 2c showing a protection layer 140 formed on the electrode layer 130a. For sonic easily oxidized materials such as SNW, a protection layer 140 is formed to isolate the electrode layer 130a from being exposed to the air so as to improve the antioxidant capacity of the electrode layer 130a. In addition, since the SNW comprises some interspaces (voids), the protection layer 140 may be in contact with the substrate through these voids. In some embodiments, the SNW is bonded with the substrate 110 strongly by choosing a material with high adhesively to the substrate 110. The material of the protection layer includes transparent materials such a silicon dioxide. The thickness of the protection layer is between 50 nm (nanometers) to 500 nm.

Figure 2D:
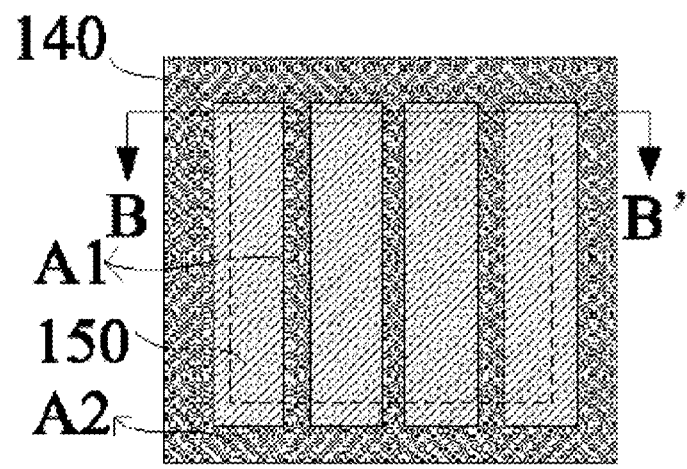
Figure 2D:
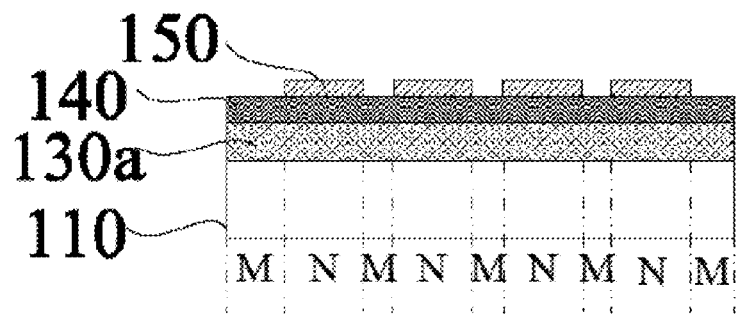

S104: forming a first anti-etching optical layer on the protection layer. Please refer to FIG. 2d' and FIG. 2d. A first anti-etching optical layer 150 is formed on the protection layer 140. The first anti-etching optical layer 150 is patterned to define the electrode pattern on the electrode layer 130a. The first anti-etching optical layer 150 includes acrylate polymer, epoxy resin or other transparent isolating materials. In some embodiments, the first anti-etching optical layer 150 is formed through a printing process. The thickness of the first anti-etching optical layer is between 0.05 μm (micrometers) to 5 μm.

Figure 2E:
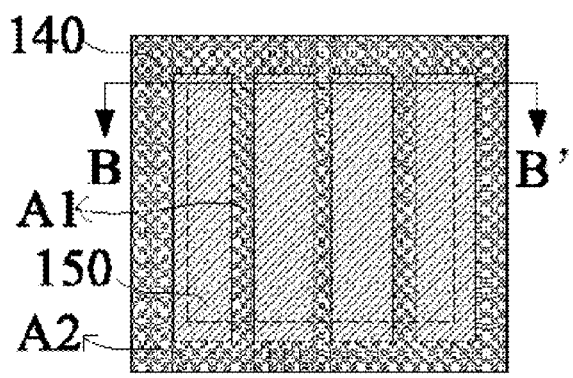
Figure 2E:
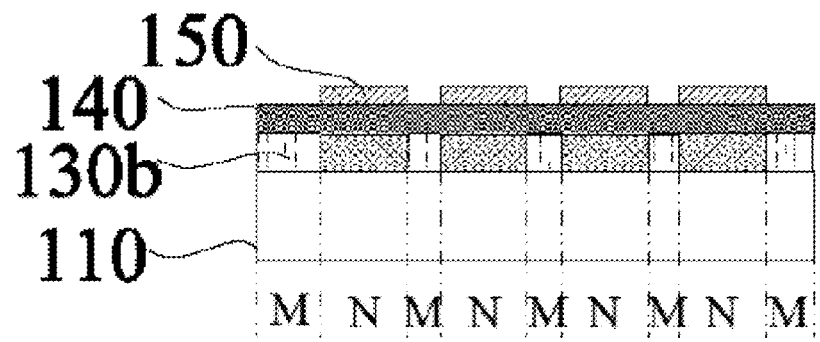

S105: etching the electrode layer that is not covered by the first anti-etching optical layer. The electrode layer is divided into an etched region and a non-etched region after the etching process. Please refer to FIG. 2e' and FIG. 2e. After the etching process is performed, an electrode layer 130b is divided into two parts: an etched region M and a non-etched region N. During the etching process, since the thickness of the protection layer 140 is thin enough, the etching solvent can penetrate the protection layer 140 and etch the electrode layer 130a within the etched region M. The electrode 130b shown in FIG. 2e' and FIG. 2e and the first anti-etching optical layer 150 have the same pattern. In some embodiments, the electrode structure includes a plurality of sensing electrodes arranged along a first direction, and each sensing electrode extends from a sensing region A1 to a trace region A2. In some embodiments, the etching process for etching the electrode layer 130a is an incomplete etching process, i.e., only parts of the electrode layer 130b within the etched region M are etched, and the electrode layer 130b of the etched region M is electrically isolated from the electrode layer 130b of the non-etched region N. In order to avoid a color difference between the electrode layer of the etched region M and the electrode layer of the non-etched region N, in some other embodiments, the etching process is a complete etching process, but not limited thereto.

Figure 2F:
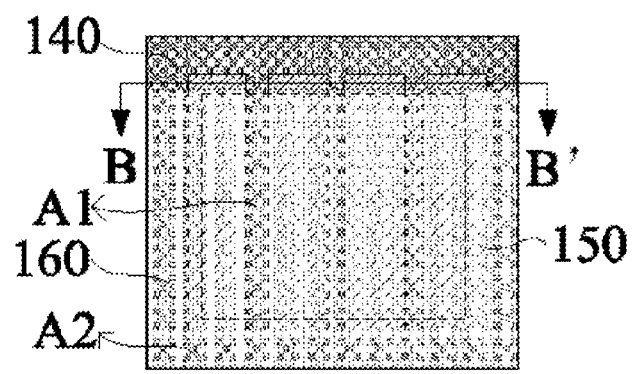
Figure 2F:
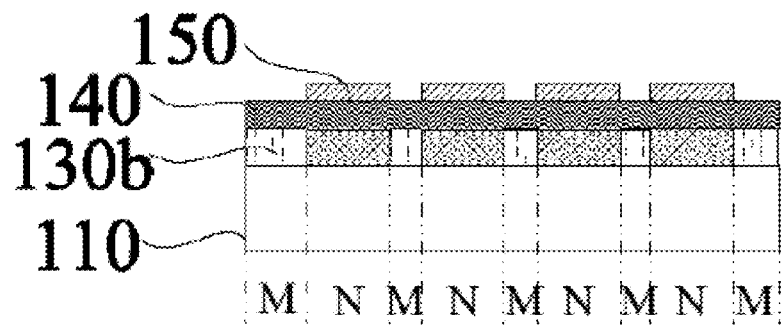

S106: forming a second anti-etching optical layer, wherein the second anti-etching optical layer at least exposes parts of the first anti-etching optical layer disposed within the trace region. Please refer to FIG. 2f' and FIG. 2f. The second anti-etching optical layer 160 is formed on the first anti-etching optical layer 150 and on the protection layer 140. The second anti-etching optical layer 160 is used to define a trace collection region of a trace layer (which will be formed in following steps). The second anti-etching optical layer 160 exposes parts of the first anti-etching optical layer 150 disposed within the trace region A2. The material of the second anti-etching optical layer 160 comprises acrylate polymer, epoxy resin or other transparent isolating materials. The thickness of the second anti-etching optical layer 160 is about from 0.05 μm to 5 μm. In some embodiments, the second anti-etching optical layer 160 can be formed through a printing process.

Figure 2G:
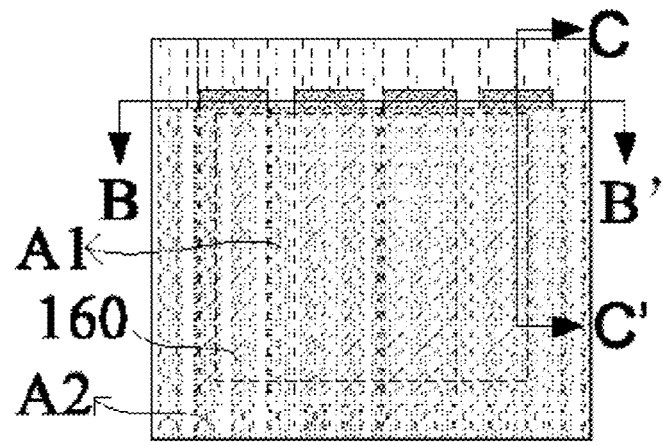
Figure 2G:
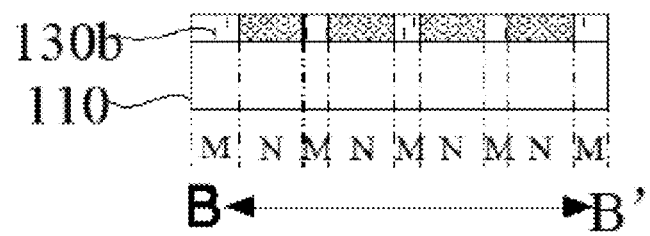
Figure 2G:
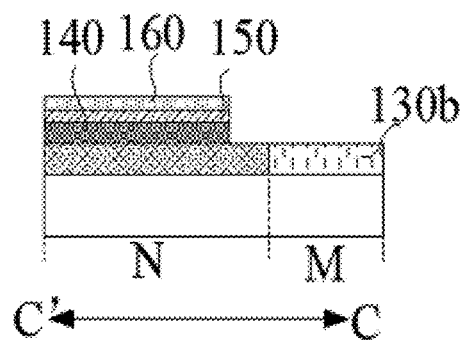

S107: etching the first anti-etching optical layer and the protection layer that is not covered by the second anti-etching optical layer, to expose at least parts of the electrode layer of the non-etched region within the trace region. Please refer to FIG. 2g'-1. FIG. 2g'-2 and FIG. 2g. The first anti-etching optical layer 150 and the protection layer 140 that is not covered by the second anti-etching optical layer 160 are etched to expose parts of the electrode layer 130b of the non-etched region N S108: forming a trace layer. Please refer to FIG. 2h'-1, FIG. 2h'-2 and FIG. 2h. A trace layer 170 is formed on the substrate 110 and is disposed within the trace region A2, wherein the trace layer 170 is electrically connected to the exposed electrode layer 130b of the non-etched region N. In some embodiments, one end of the trace layer 170 is electrically connected to each sensing electrode, and the other end of each trace layer 170 is collected into a trace collection region A3. It is worth noting that time amount and the size of the trace collection region A3 can be adjusted, and is not limited to the amount and the size shown in the figure. The trace layer 170 within the trace collection region A3 is electrically connected to an external controller (not shown) through a flexible circuit board, to analyze the signals transferred from the trace layer 170. The trace layer 170 comprises transparent materials such as ITO, metals such as silver or aluminum, alloys of molybdenum., aluminum, or a composition thereof.

Figure 2H:
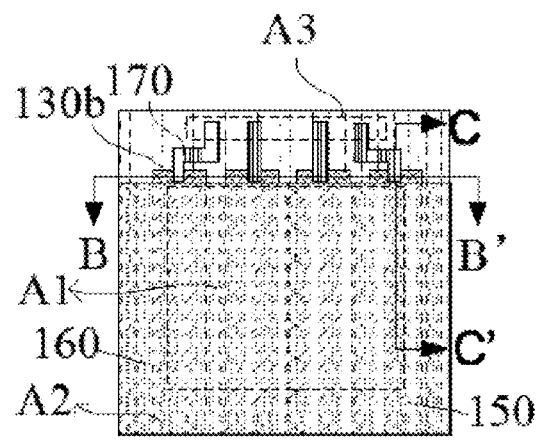
Figure 2H:
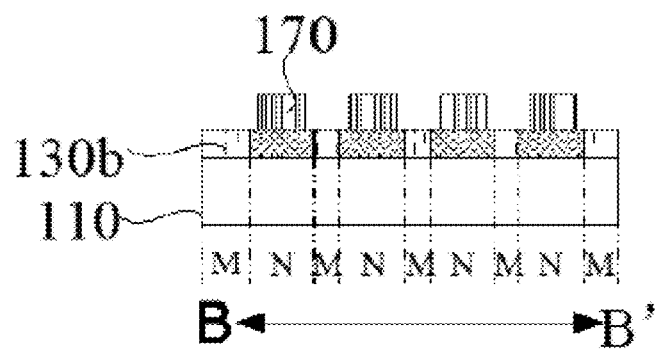
Figure 2H:
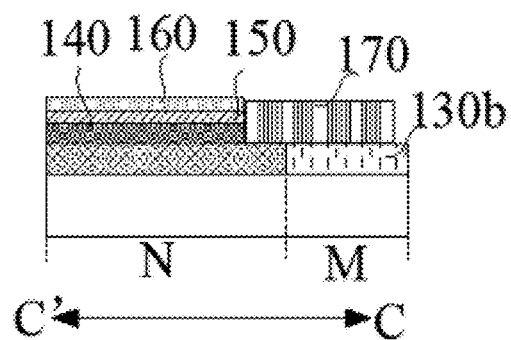

Please refer to FIG. 2h-1, FIG. 2h'-2 and FIG. 2h. The touch structure mentioned above comprises: a substrate 110 having a sensing region A1 and a trace region A2 on it; an electrode layer 130b, disposed on the substrate 110, and the electrode layer 130b is divided into an etched region M and a non-etched region N; a protection layer 140 disposed on the electrode layer 130b and on the substrate 110; a first anti-etching optical layer 150 disposed on the protection layer 140 within the non-etched region N; a second anti-etching optical layer 160, which is disposed on the protection layer 140 and on the first anti-etching optical layer 150. The protection layer 140, the first anti-etching, optical layer 150 and the second anti-etching optical layer 160 expose parts of the electrode layer 130b of the non-etched region N within the trace region A2; a trace layer 170, disposed within the trace region A2, electrically connected to the exposed electrode layer 130b of the non-etched region N. In this embodiment, the trace layer 170 is disposed on the substrate 110. The other components, material properties of the touch structure are described in detail in the manufacturing process mentioned above and will not be redundantly described here.

Figures 1, 2I:
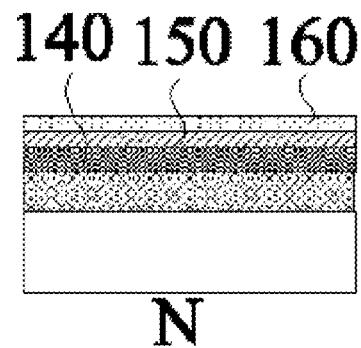
FIG. 2i'-1 and FIG. 2i'-1 are cross sectional views of an etched region and a non-etched region of the touch structure respectively.
Figures 2, 2I:
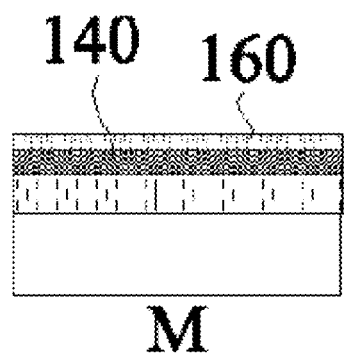

Please refer to FIG. 2h'-1, FIG. 2h'2, FIG. 2i-1 and FIG. 2i-2. In the touch structure of the present disclosure, within the sensing region A1, the protection layer 140 and the second anti-etching, optical layer 160 are disposed on the electrode layer 130b within the etched region M, and the protection layer 140, the first anti-etching optical layer 150, the second anti-etching optical layer 160 are disposed on the electrode layer 130b within the non-etched region N. By adjusting the refractive index of the protection layer 140, the refractive index of the first anti-etching optical layer 150 and the refractive index of the second anti-etching optical layer 160, the display differences between the etched region M and the non-etched region N can be reduced, and ensure the touch structure of the present disclosure used as a touch device to achieve better display performance. In one or more preferred embodiments, the refractive index of the first anti-etching optical layer 150 is larger than the refractive index of the protection layer 140, with an index difference at least larger than 0.1; the refractive index of the second anti-etching optical layer 160 is larger than the refractive index of the first anti-etching optical layer 150 with an index difference at least larger than 0.1. However, the refractive index of the protection layer 140, the first anti-etching optical layer 150 and the second anti-etching optical layer 160 can be adjusted according to the different materials of the electrode layer. Besides, the thickness of the protection layer 140 is preferably comprised between 50 nm to 500 nm, which allows the electrode layer 130a to be easily penetrated when the etching process is performed. The thickness of the first anti-etching optical layer 150 and of the second anti-etching optical layer 160 is preferably comprised between 0.05 μm to 5 μm, which ensures a good optical transmittance of the touch structure, in addition, compared to the conventional manufacturing process, in the present disclosure, there are no steps for removing a hard mask used to define the electrode layer 130a, thereby simplifying the manufacturing process and increasing the yield.

Figure 3A:
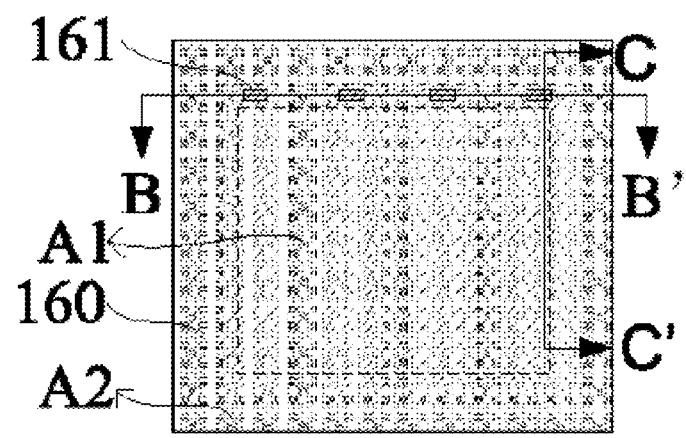
FIG. 3a~FIG. 3c are top views of as touch structure according to various embodiments of the present disclosure.
Figure 3A:
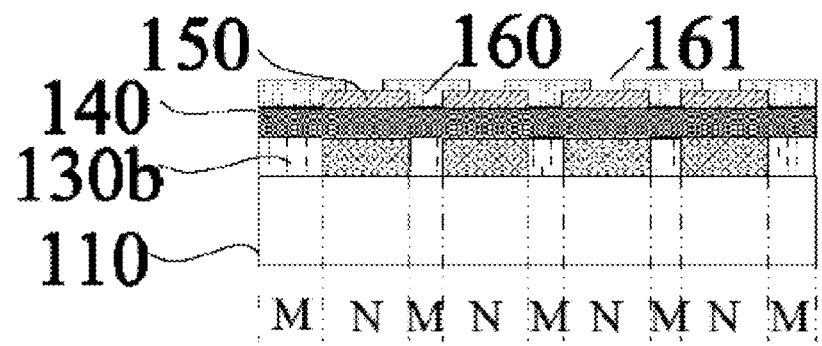

In some other embodiments of the present disclosure, a hollow region is formed on the second anti-etching optical layer, and a plurality of via holes disposed correspondingly to the hollow region are formed on the protection layer and on the first anti-etching optical layer; the trace layer is formed on the second anti-etching optical layer and is electrically connected to the exposed electrode layer of the non-etched region through the hollow region and through the via holes. Please refer to the following description:

Please refer to FIG. 3a'and FIG. 3a. The second anti-etching optical layer 160 which is formed in step S106 comprises a hollow region 161 and the first anti-etching optical layer 150 within the trace region A2 is exposed by the second anti-etching optical layer 160 through the hollow region 161. In other words, within the trace region A2, the hollow region 161 exposes the first anti-etching optical layer 150 of each sensing electrode.

Figure 3B:
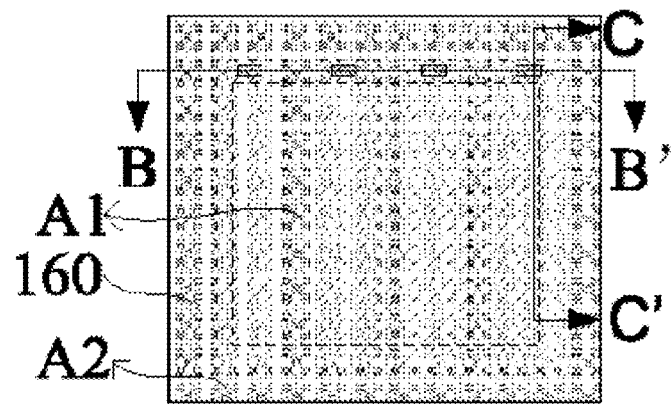
Figure 3B:
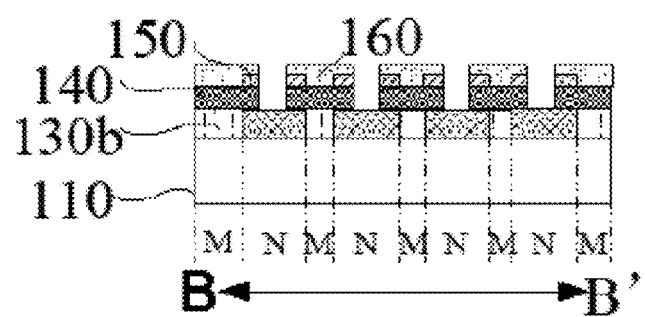
Figure 3B:
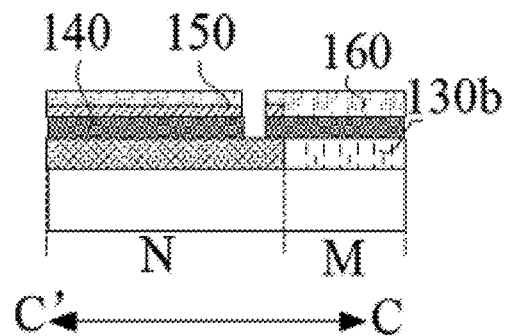

Please refer to FIG. 3b'-1 FIG. 3b'-2 and FIG. 3b, wherein the same process is used to etch the first anti-etching optical layer 150 and the protection layer 140 within the hollow region 161, and a plurality of via holes disposed correspondingly to the hollow region 161 are formed on the first anti-etching optical layer 150 and on the protection layer 140.

Figure 3C:
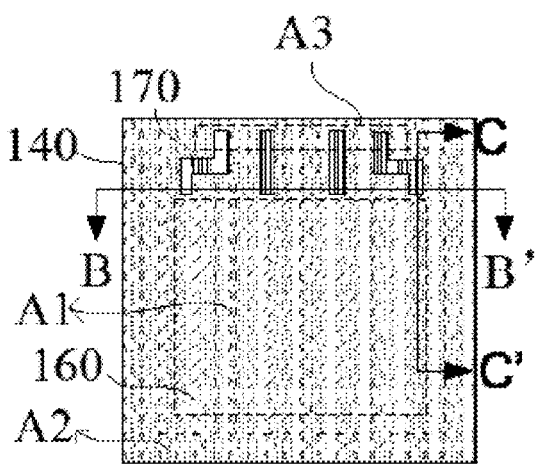
Figure 3C:
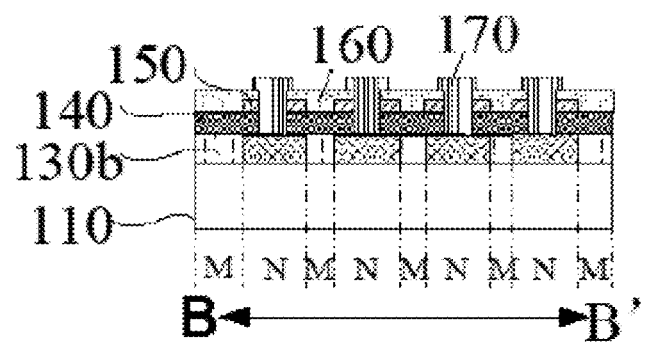
Figure 3C:
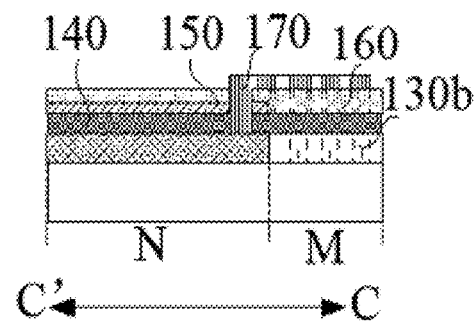

Please refer to FIG. 3c'-1, FIG. 3c'-2 and FIG. 3c, wherein the same process is used as mentioned above. The trace layer 170 is formed within the trace region A2, wherein the trace layer 170 is formed on the second anti-etching optical layer 160 and is electrically connected to each sensing electrode through the hollow region 161 and through the via holes. Other characteristics are similar to those mentioned above, and will not be redundantly described here.

Figure 4A:
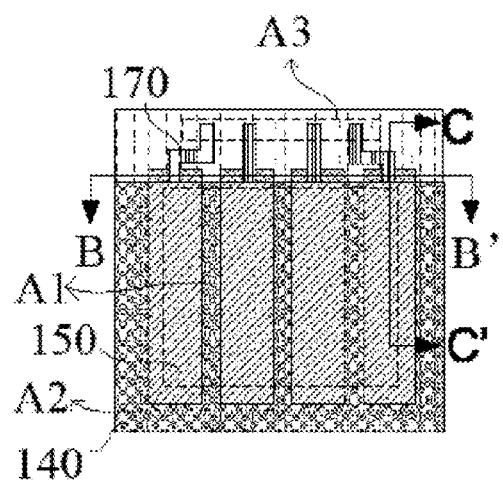
Figure 4B:
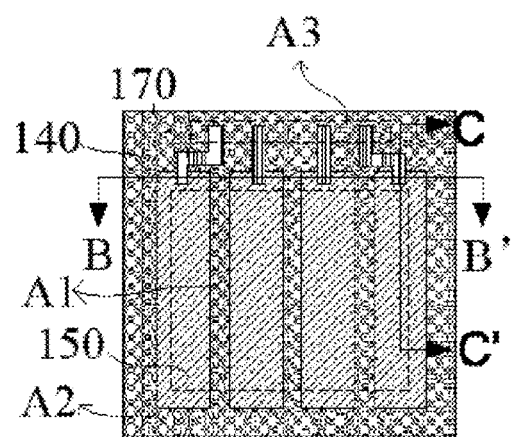

Please refer to FIG. 4a and FIG. 4b. After the touch structure shown in step S107 is formed (as shown in FIG. 2g or FIG. 3a), a step for removing the second anti-etching optical layer 160 is selectively performed. In other words, in some embodiments, by adjusting only the refractive index of the protection layer 140 and the refractive index of the first anti-etching optical layer 150, the display differences between the etched region M and the non-etched region N is reduced.

Figure 5:
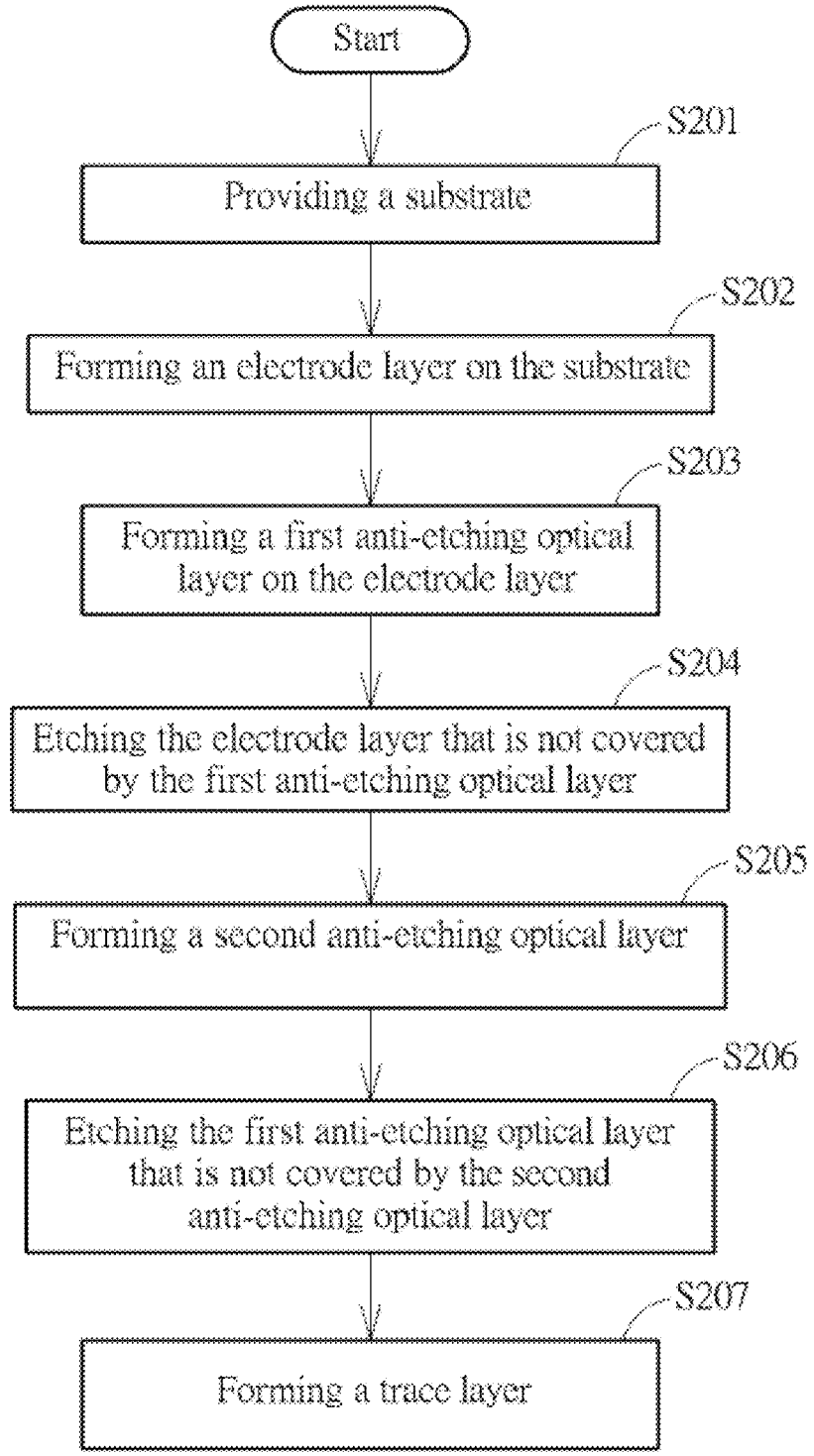
FIG. 5 is a flow chart showing another manufacturing process of the touch structure according to some other embodiments of the present disclosure.
Figure 6A:
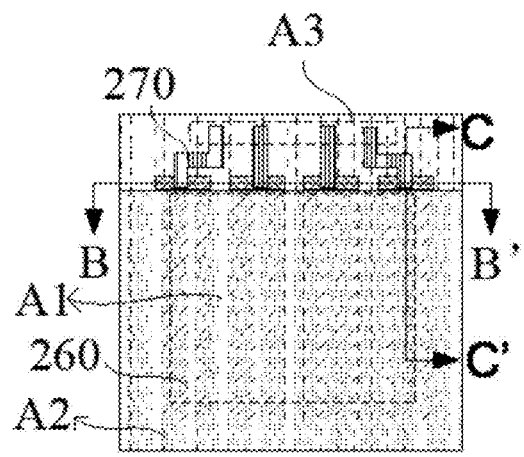
FIG. 6a is a top view of a touch structure formed by the manufacturing process of FIG. 5.
Figure 6A:
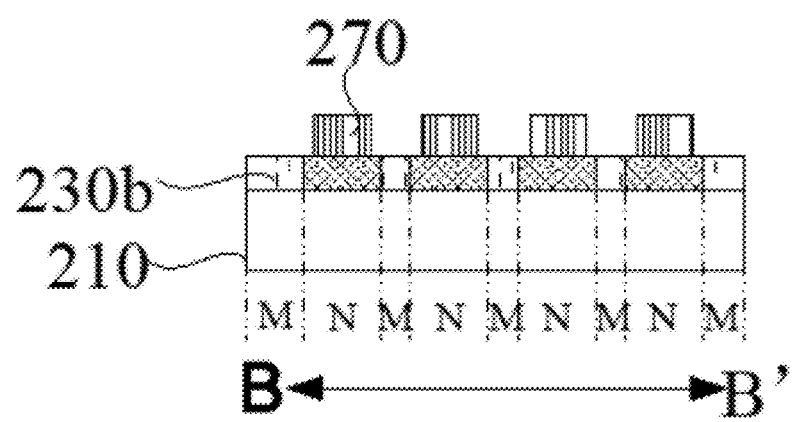
Figure 6A:
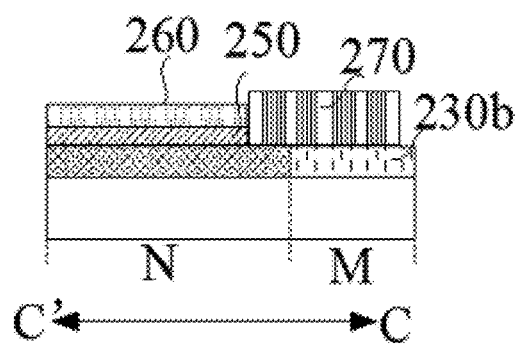

Please refer to FIG. 5, FIG. 6a, FIG. 6a'-1 and FIG. 6a'-2. FIG. 5 is a flow chart showing another manufacturing process of the touch structure according to some other embodiments of the present disclosure. FIG. 6a is a top-view diagram showing a touch structure formed through the manufacturing, process of FIG. 5. FIG. 6a'-1 is a cross sectional view taken along the section line B-B' of FIG. 6a. FIG. 6a'-2 is a cross sectional view taken along the section line C-C' of FIG. 6a. The process comprises: step S201: providing a substrate; step S102: forming an electrode layer on the substrate. The difference between this embodiment and the process shown in FIG. 1 is that the steps for forming the protection layer is skipped when the electrode layer is made of metal oxide such as ITO, AZO . . . , wherein these material have a better antioxidant capacity and a better adhesively. The first anti-etching optical layer is directly formed on the electrode layer step S203). The electrode layer that is not covered by the first anti-etching optical layer is then etched (step S204). A second anti-etching optical layer is then formed (step S205), wherein the second anti-etching optical layer at least exposes pails of the first anti-etching, optical layer within the trace region. The first anti-etching optical layer that is not covered by the second anti-etching optical layer is then etched (step S206) to expose the electrode layer of the non-etched region within the trace region. Finally, the trace layer is formed (step S207). The other characteristics of this embodiment are similar to those of the embodiments shown in FIG. 1, and will not be redundantly described here.

Please refer to FIG. 6a'-1, FIG. 6a'-2 and FIG. 6a. The touch structure formed through the manufacturing process shown in FIG. 5 comprises: a substrate 210 having a sensing region A1 and a trace region A2 thereon; a electrode layer 230b disposed on the substrate 210, wherein the electrode layer 230b is divided into an etched region M and a non-etched region N; a first anti-etching optical layer 250 disposed on the electrode layer 230b within the non-etched region N; a second anti-etching, optical layer 260, which is disposed on the substrate 210 and on the first anti-etching optical layer 250. The first anti-etching optical layer 250 and the second anti-etching optical layer 260 expose parts of the electrode layer 230b of the non-etched region N within the trace region A2 and a trace layer 270 disposed within the trace region A2 is electrically connected to the exposed electrode layer 230b of the non-etched region N. In this embodiment, the trace layer 270 is disposed on the substrate 210. In some other embodiments, a hollow region is formed on the second anti-etching optical layer 260, a plurality of via holes disposed correspondingly to the hollow region is formed on the first anti-etching optical layer 250, the trace layer 270 is electrically connected to the electrode layer 230b of the non-etched region N within the trace region A2 through the hollow region and through the via holes. The other characteristics of this embodiment are similar to those of the embodiments mentioned above, and will not be redundantly described here.

Figure 7A:
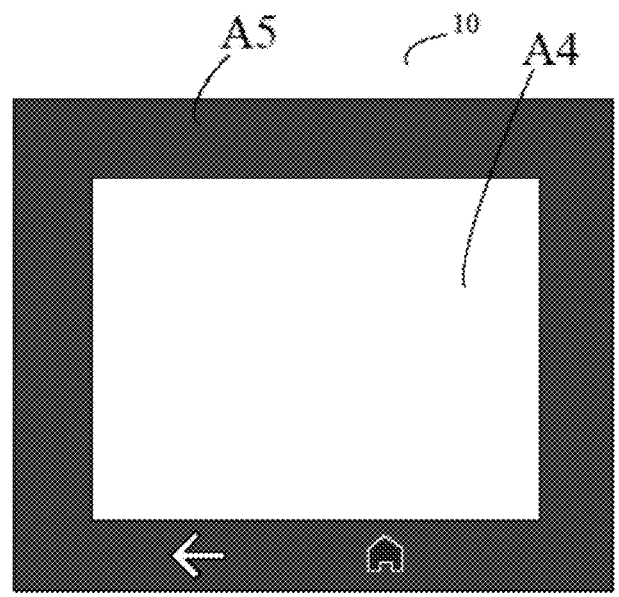
FIG. 7a is a top view of a touch display device comprising the touch structure of the present disclosure.
Figure 7B:
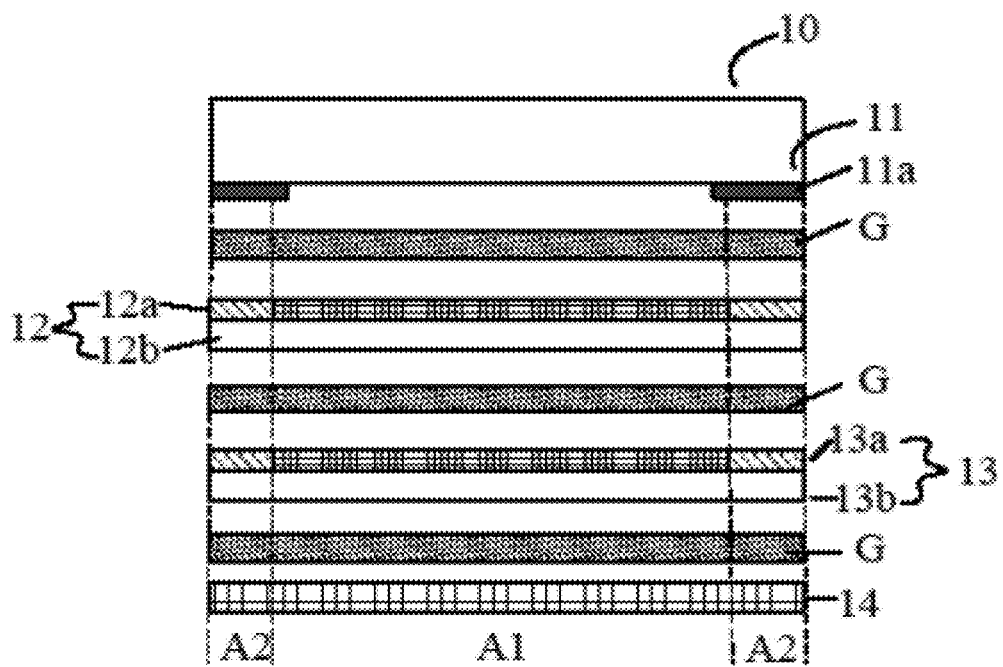

Please refer to FIG. 7a and FIG. 7b. FIG. 7a is a top-view diagram showing a touch display device comprising the touch structure of the present disclosure. FIG. 7b is a cross sectional view of FIG. 7a. In this embodiment, a touch display device 10 comprises: a display region A4 and a decoration region A5 surrounding the display region A4; a cover lens 11, a first touch structure 12, a second touch structure 13 and a display module 14 are stacked in sequence. These components are combined to each other with an adhesive layer G. The cover lens 11 may have a flat shape or a curved shape so as to be adapted to different types of touch panels. In this embodiment, a shading layer 11a is formed on the surface that of the cover lens 11, disposed on the same surface as the one the first touch structure 12 disposed on, and is disposed within the decoration region A5. The shading layer 11a comprises a hollow pattern, such as a bottom pattern or a logo trademark. In some other embodiments of the present disclosure, the shading layer 11a and the first touch structure 12 may disposed on different surfaces (in other words, the shading layer 11a, may disposed on the opposite surface of the cover lens 11), the shading layer 11a may comprise a color ink or a color photoresist layer. In addition, an anti-glare layer, a stain-resistant layer and other functional layers may be formed on another surface of the cover lens 11 (i.e. the opposite surface of the surface that the first touch structure 12 disposed on). The first touch structure 12 and the second touch structure 13 may comprise the touch structure described in the embodiments mentioned above, wherein the components 12b and 13b shown in figures are substrates; the components 12a and 13a shown in figures are the touch structure formed on the substrate. Preferably, the touch electrode of the first touch structure 12 and the touch electrode of the second touch structure 13 are perpendicular to each other. The shading layer 11a within the decoration region A5 is used for hiding the traces of the first touch structure 12 and the second touch structure 13 within the trace region A2. The display module 14 can be a liquid crystal display module (LCD module) or other display panels. The adhesive layer G may include transparent adhesive layer, such as a solid optical clear adhesive or a liquid optical clear adhesive. In this embodiment, the adhesive layer G covers the whole surface of the cover lens 11, but in some other embodiments of the present disclosure, the adhesive layer G may be disposed on partial regions only, such as disposed on the decoration region A5 only.

Figure 8A:
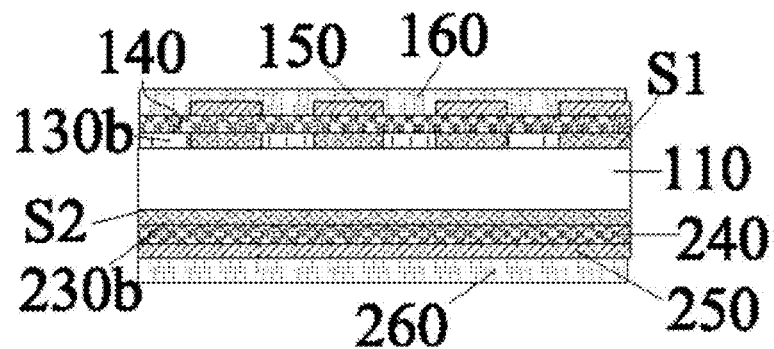
FIG. 8a is a cross sectional view of a touch structure according to some other preferred embodiments of the present disclosure.
Figure 8B:
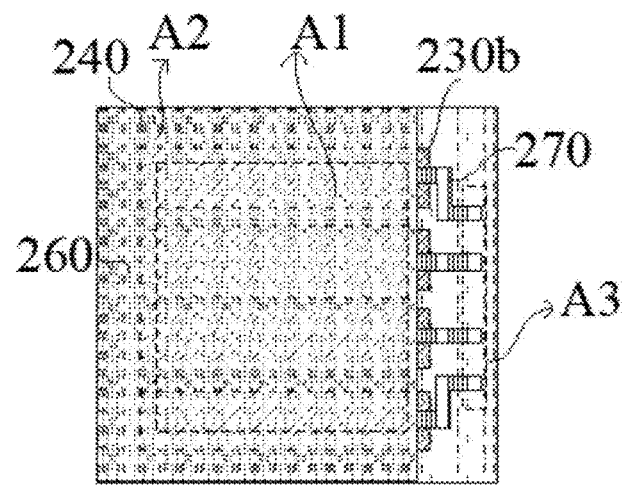
Figure 8C:
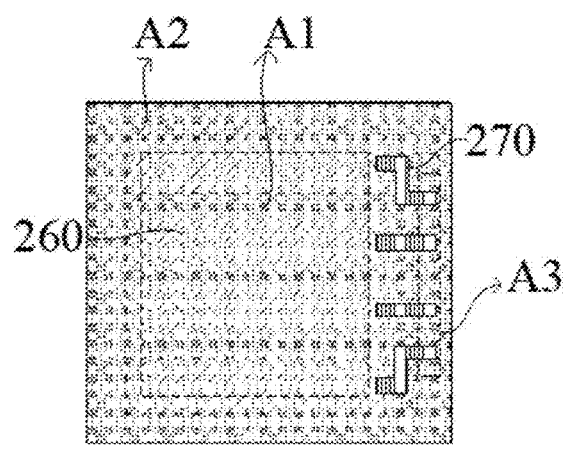

Please refer to FIG. 8a. FIG. 8a is a cross sectional view showing a touch structure according to some other preferred embodiments of the present disclosure. After a touch structure is formed on the first surface S1 of the substrate 110, a manufacturing process shown in FIG. 1 (or FIG. 5) can be further performed to form another touch structure on the second surface S2 of the substrate 110. As shown in FIG. 8b or FIG. 8c, the touch structure formed on the second surface S2 comprises a patterned electrode layer 230b, wherein the electrode layer 230b consists of a plurality of sensing electrodes arranged along a second direction. The other characteristics of the touch structure are similar to those of the embodiments mentioned above, and will not be redundantly described here.

Figure 9:
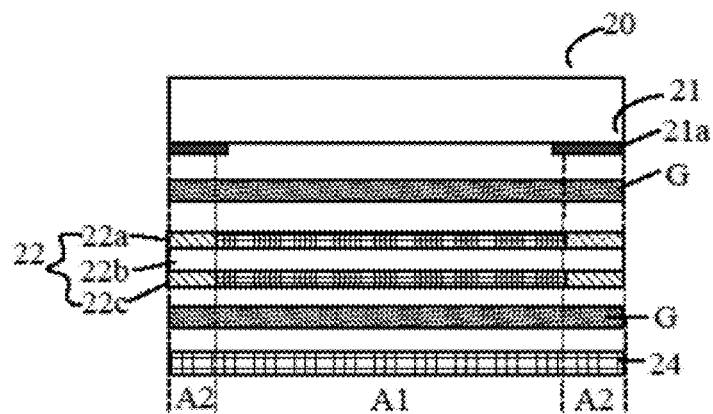
Figure 10:
FIG. 10 and FIG. 11 show two different types of electrode layers of the touch structure of the present disclosure.
Figure 10:
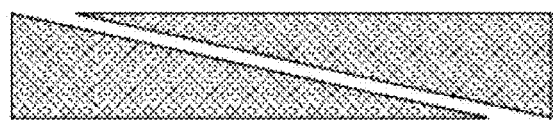
Figure 10:
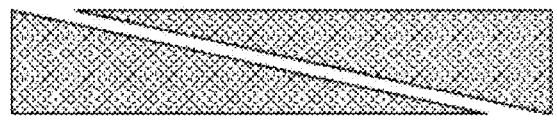
Figure 11:
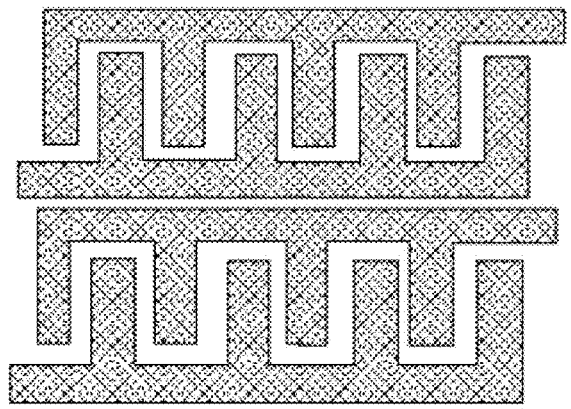

Please refer to FIG. 9; FIG. 9 is a cross sectional view showing a touch device using the touch structure of FIG. 8a. A touch display device 20 comprises a cover lens 21, a touch structure 22 and a display module 24 that are stacked in sequence. These components are combined to each other with an adhesive layer G. A shading layer 21a is formed surrounding the cover lens 21; the touch structure 22 comprises a substrate 22b; and a touch structure 22a and 22c are respectively formed on a first surface and on a second surface of the cover lens 21. The other characteristics of the cover lens 21, the shading layer 21a, the display module 24 and the adhesive layer G are similar to those of the touch device shown in FIG. 7b, and will not be redundantly described here Please refer to FIG. 10 and FIG. 11. The touch structure of the present disclosure further comprises other types and can be a single layer electrode structure, such as the symmetrical triangular structure as shown in FIG. 10, or a staggered comb-shaped structure as shown in FIG. 11.

Compared to the conventional process, the present disclosure does not need the steps of removing the hard mask that defines the electrodes pattern and of removing the hard mask that defines the traces pattern, so the manufacturing process can be simplified, thereby improving the yield. Besides, the refractive index of the first anti-etching optical layer and the refractive index of the second anti-etching optical layer can be adjusted, so that the display difference between the etched region and the non-etched region can be reduced.

Those skilled in the art will readily observe that numerous modifications and alterations of the device and method may he made while retaining the teachings of the disclosure. Accordingly, the above disclosure should be construed as limited only by the metes and bounds of the appended claims.

What is claimed is:

1. A manufacturing process for forming a touch structure, at least comprising the following steps:
   providing a substrate, wherein a sensing region and a trace region surrounding the sensing region are defined on the substrate;
   forming an electrode layer on a substrate;
   forming a first anti-etching optical layer on the electrode layer;
   etching the electrode layer that is not covered by the first anti-etching optical layer, thereby dividing the electrode layer into an etched region and a non-etched region;
   forming a second anti-etching optical layer on the first anti-etching optical layer and on the substrate, wherein the second anti-etching optical layer at least exposes parts of the first anti-etching optical layer within the trace region;
   etching the first anti-etching optical layer that is not covered by the second anti-etching optical layer to expose the electrode layer of the non-etched region within the trace region; and
   forming a trace layer disposed within the trace region, wherein the trace layer is electrically connected to the exposed electrode layer of the non-etched region.

2. The manufacturing process for forming a touch structure of claim 1, wherein the step of forming the electrode layer further comprises forming a protection layer on the electrode layer, the second anti-etching optical layer is formed on the first etching optical layer and the protection layer, and the step of etching the first anti-etching optical layer that is not covered by the second anti-etching optical layer further comprises etching the protection layer that is not covered by the second anti-etching optical layer.

3. The manufacturing process for forming a touch structure of claim 1, wherein the step of etching the first anti-etching optical layer that is not covered by the second anti-etching optical layer further comprises removing the second anti-etching optical layer.

4. The manufacturing process for forming a touch structure of claim 1, wherein the step of forming a second anti-etching optical layer is an incomplete etching process.

5. The manufacturing process for forming a touch structure of claim 1, wherein the first anti-etching optical layer and the second anti-etching optical layer comprise transparent isolating materials.

6. The manufacturing process for forming a touch structure of claim 1, wherein the first anti-etching optical layer and the second anti-etching optical layer are formed through a printing process.

7. The manufacturing process for forming a touch structure of claim 1, wherein the second anti-etching optical layer comprises a hollow region, and parts of the first anti-etching optical layer within the trace region are exposed by the hollow region, the step of etching the first anti-etching optical layer that is not covered by the second anti-etching optical layer further comprises forming a plurality of via holes disposed correspondingly to the hollow region, and the trace layer is disposed on the second anti-etching optical layer and is electrically connected to the exposed electrode layer of the non-etched region through the hollow region and the via holes.

8. The manufacturing process for forming a touch structure of claim 1, wherein the trace layer is disposed on the substrate.

9. A touch panel, comprising:
a substrate having a sensing region and a trace region surrounding the sensing region;
an electrode layer, disposed on the substrate, wherein the electrode layer is divided into an etched region and a non-etched region;
a first anti-etching optical layer, disposed on the electrode layer of the non-etched region;
a second anti-etching optical layer, disposed on the first anti-etching optical layer and on the substrate, and at least parts of the electrode layer within the trace region are exposed by the first anti-etching optical layer and the second anti-etching optical layer; and
a trace layer, disposed within the trace region, and electrically connected to the exposed electrode layer of the non-etched region.

10. The touch panel of claim 9, further comprising a protection layer disposed on the electrode layer, wherein the protection layer is disposed between the electrode layer and the first anti-etching optical layer.

11. The touch panel of claim 10, wherein the thickness of the protection layer is comprised between 50 nm (nanometer) to 500 nm.

12. The touch panel of claim 10, wherein the refractive index of the first anti-etching optical layer is larger than the refractive index of the protection layer by at least 0.1.

13. The touch panel of claim 9, wherein the refractive index of the second anti-etching optical layer is larger than the refractive index of the first anti-etching optical layer by at least 0.1.

14. The touch panel of claim 9, wherein the second anti-etching optical layer comprises a hollow region, and the first anti-etching optical layer comprises a plurality of via holes disposed correspondingly to the hollow region and wherein the trace layer is disposed on the second anti-etching optical layer and is electrically connected to the exposed electrode layer of the non-etched region through the hollow region and the via holes.

15. The touch panel of claim 9, wherein the trace layer is disposed on the substrate.

16. The touch panel of claim 9, wherein the thickness of the first anti-etching optical layer is between 0.05 µm (micrometer) and 5 µm.

17. The touch panel of claim 9, wherein the thickness of the second anti-etching optical layer is between 0.05 µm (micrometer) and 5 µm.

18. The touch panel of claim 9, wherein the first anti-etching optical layer and the second anti-etching optical layer comprise transparent isolating materials.

19. The touch panel of claim 12, wherein the refractive index of the second anti-etching optical layer is larger than the refractive index of the first anti-etching optical layer by at least 0.1.

* * * * *